(12) United States Patent
Robinson et al.

(10) Patent No.: US 11,967,541 B2
(45) Date of Patent: Apr. 23, 2024

(54) LIQUID-BASED HEAT EXCHANGER

(71) Applicant: The Provost, Fellows, Foundation Scholars and the other members of Board, of the College of the Holy and Undivided Trinity of Queen Elizabeth, Near Dublin, Collage Green (IE)

(72) Inventors: Anthony Robinson, Collage Green (IE); Cathal Wilson, Collage Green (IE); Leo Celdran, Collage Green (IE); Nicolas Baudin, Collage Green (IE)

(73) Assignee: The Provost, Fellows, Foundation Scholars and the other members of Board, of the College of the Holy and Undivided Trinity of Queen Elizabeth, Near Dublin, College Green (IE)

( * ) Notice: Subject to any disclaimer, the term of this patent is extended or adjusted under 35 U.S.C. 154(b) by 664 days.

(21) Appl. No.: 17/264,679

(22) PCT Filed: Jul. 31, 2019

(86) PCT No.: PCT/EP2019/070713
§ 371 (c)(1),
(2) Date: Jan. 29, 2021

(87) PCT Pub. No.: WO2020/025716
PCT Pub. Date: Feb. 6, 2020

(65) Prior Publication Data
US 2021/0320050 A1 Oct. 14, 2021

(30) Foreign Application Priority Data
Aug. 2, 2018 (GB) ..................................... 1812592

(51) Int. Cl.
*H01L 23/473* (2006.01)
*F28D 3/02* (2006.01)

(52) U.S. Cl.
CPC ............ *H01L 23/4735* (2013.01); *F28D 3/02* (2013.01)

(58) Field of Classification Search
CPC ........... H01L 21/4882; H01L 23/13–14; H01L 23/4336; H01L 23/34; H01L 23/36; (Continued)

(56) References Cited

U.S. PATENT DOCUMENTS

| 5,263,536 | A | | 11/1993 | Hulburd et al. |
| 5,959,351 | A | * | 9/1999 | Sasaki ................... H01L 23/473 257/E23.098 |

(Continued)

FOREIGN PATENT DOCUMENTS

| WO | 2016069299 A1 | 5/2016 |
| WO | 2016069414 A1 | 5/2016 |

OTHER PUBLICATIONS

EPO; International Search Report and Written Opinion dated Nov. 4, 2019 in Application No. PCT/EP2019/070713.
(Continued)

*Primary Examiner* — Amir A Jalali
(74) *Attorney, Agent, or Firm* — Snell & Wilmer L.L.P.

(57) ABSTRACT

A liquid cooled thermal heat sink is provided. A plurality of jet orifices provide an exit for pressurised liquid to exit a plenum chamber and impinge on a thermal surface whereby they effect a cooling of the thermal surface, the heated liquid being transferred through an exit channel to dissipate heat away from the thermal surface.

15 Claims, 5 Drawing Sheets

(58) Field of Classification Search
CPC ............... H01L 23/3736; H01L 23/427; H01L 23/4275; H01L 23/473; H01L 23/4735; H01L 23/40; H01L 33/64; H01L 33/648; H05K 7/20; H05K 7/20218; H05K 7/20254; H05K 7/20263; H05K 7/20272; H05K 7/20281; H05K 7/2029; H05K 7/20327; H05K 7/20345; H05K 7/2039; H05K 7/20436; H05K 7/20472; H05K 7/20481; F28D 15/00; F28D 15/0266; F28D 15/04; F28D 15/046; F28D 2021/0028; F28D 3/02; F28F 11/00; G06F 1/20; G06F 2200/201

See application file for complete search history.

(56) References Cited

U.S. PATENT DOCUMENTS

| | | | | |
|---|---|---|---|---|
| 9,257,365 | B2* | 2/2016 | Joshi | ................... H01L 23/4336 |
| 2005/0072177 | A1 | 4/2005 | Hale et al. | |
| 2006/0250773 | A1* | 11/2006 | Campbell | ........... H01L 23/4735 |
| | | | | 165/80.4 |
| 2006/0250774 | A1* | 11/2006 | Campbell | ........... H01L 23/4735 |
| | | | | 361/699 |
| 2007/0274045 | A1* | 11/2007 | Campbell | .......... H05K 7/20772 |
| | | | | 165/80.4 |
| 2008/0037221 | A1 | 2/2008 | Campbell et al. | |
| 2009/0314467 | A1* | 12/2009 | Campbell | ........... H01L 23/4735 |
| | | | | 165/80.4 |
| 2013/0233523 | A1 | 9/2013 | Parida | |
| 2014/0140006 | A1* | 5/2014 | Kuhlmann | ............... H01L 23/00 |
| | | | | 165/104.33 |
| 2014/0190665 | A1 | 7/2014 | Joshi et al. | |
| 2014/0190668 | A1 | 7/2014 | Joshi et al. | |
| 2015/0043164 | A1* | 2/2015 | Joshi | ........................ G06F 1/20 |
| | | | | 165/185 |
| 2016/0128238 | A1* | 5/2016 | Shedd | ..................... F25B 41/42 |
| | | | | 361/679.47 |
| 2017/0094837 | A1* | 3/2017 | Joshi | .................. H05K 7/20327 |
| 2017/0196120 | A1* | 7/2017 | Oprins | ............... H05K 7/20272 |
| 2017/0250123 | A1 | 8/2017 | Bandhauer et al. | |
| 2020/0105645 | A1* | 4/2020 | Mydlarski | ........... H01L 23/4735 |
| 2021/0351108 | A1* | 11/2021 | Diglio | ................. H01L 23/4735 |

OTHER PUBLICATIONS

UKIPO; Combined Search and Examination Report dated Jan. 22, 2019 for Application No. 1812592.2.

\* cited by examiner

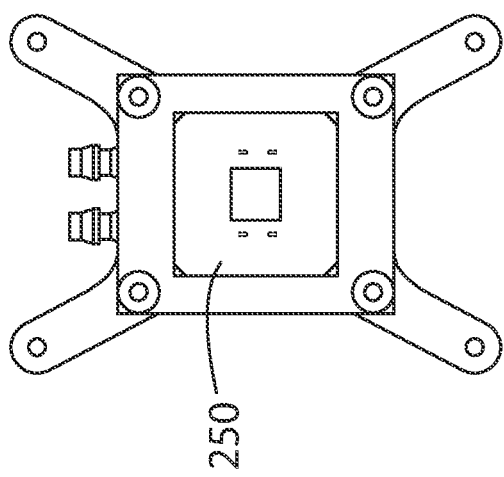
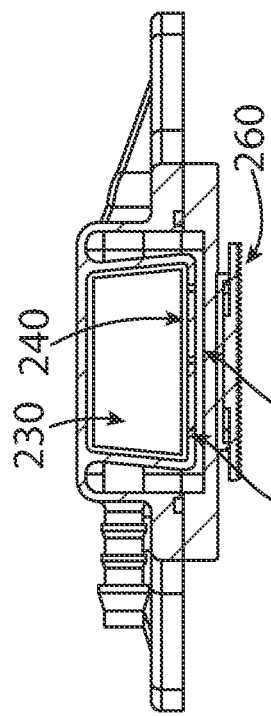
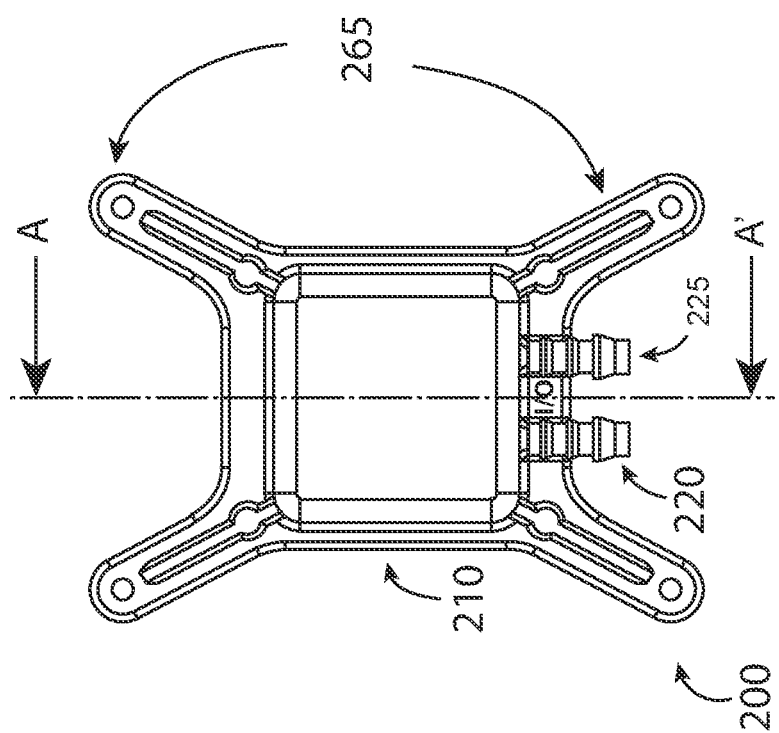

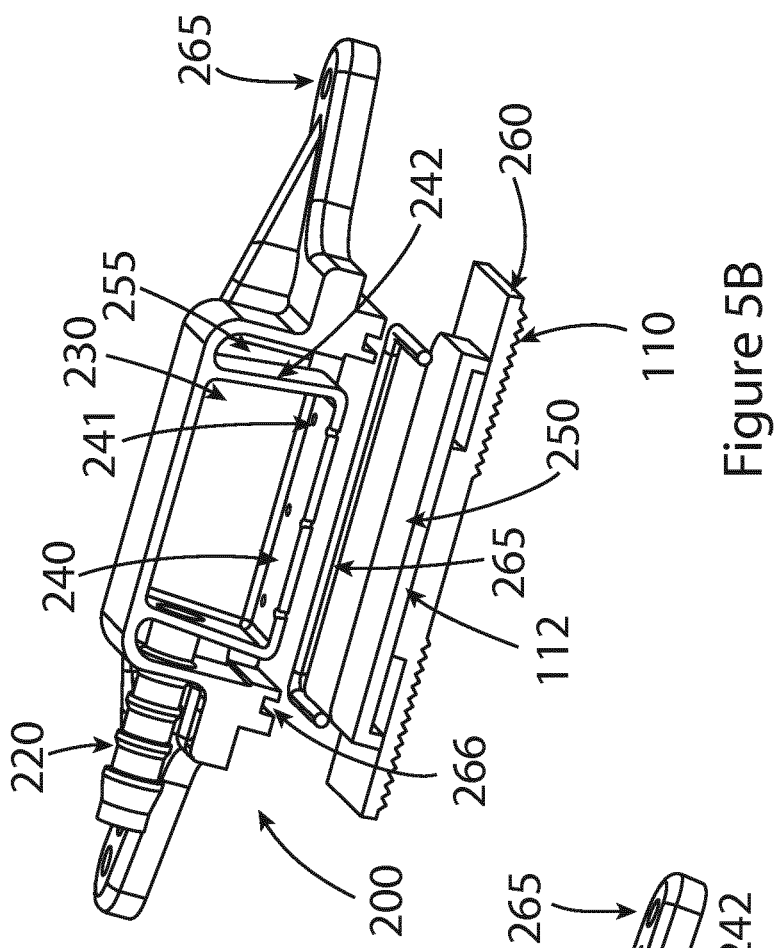
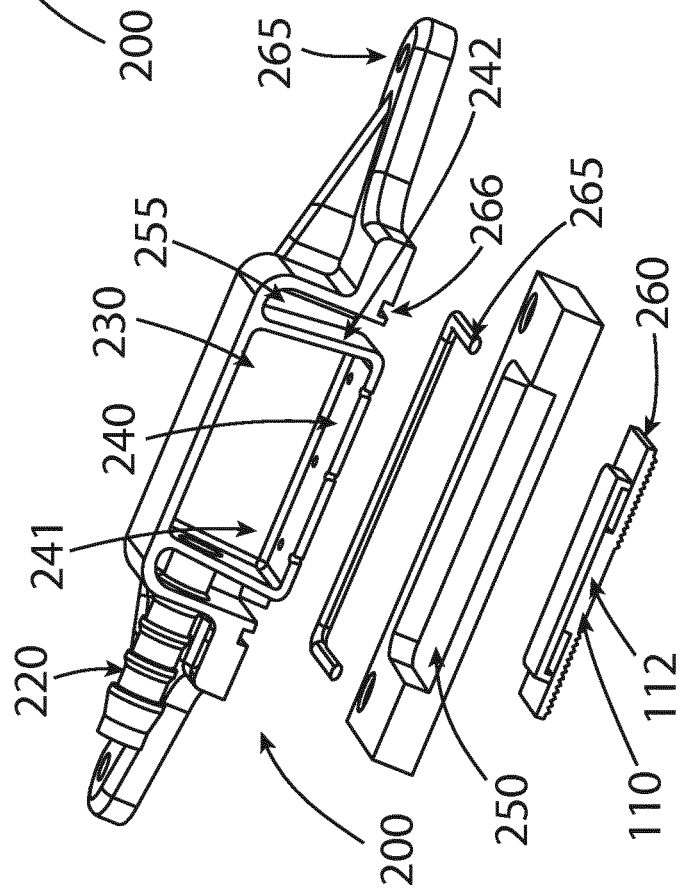
Figure 5B
Figure 4B

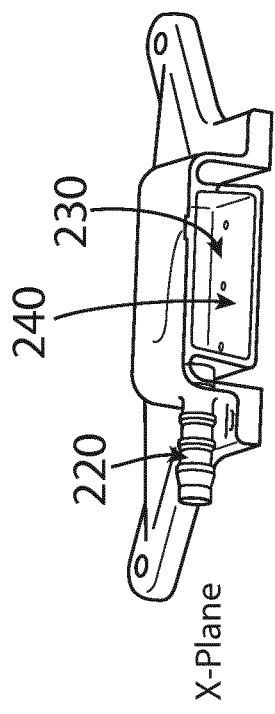
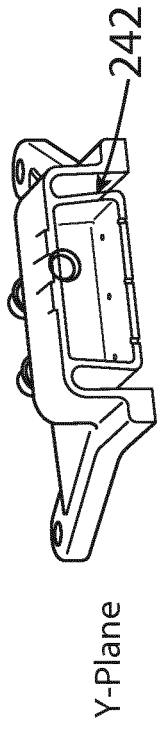
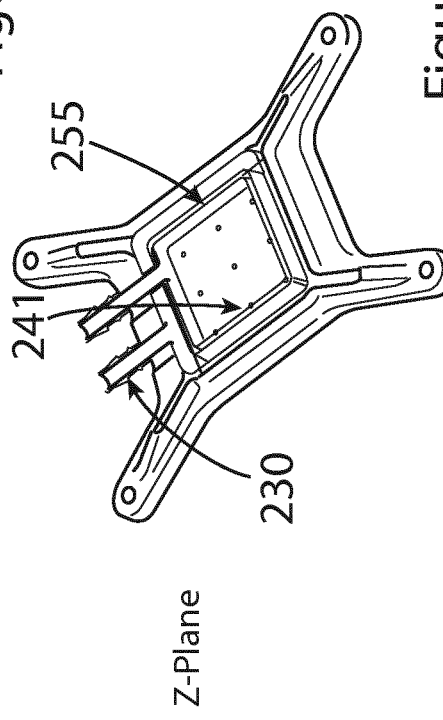
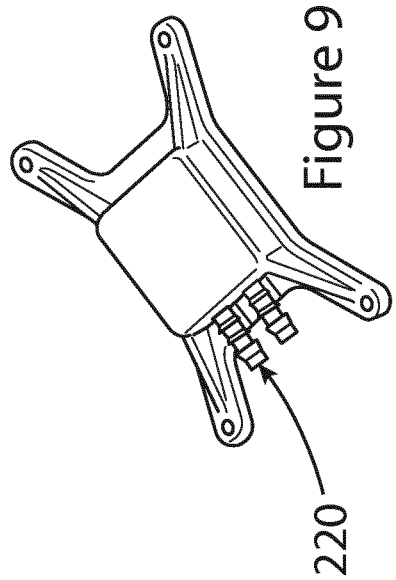
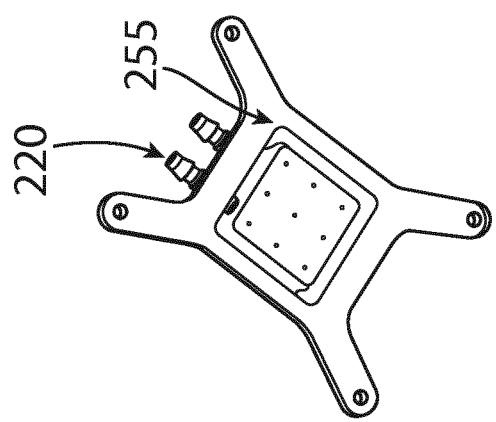

LIQUID-BASED HEAT EXCHANGER

This application is a national stage entry of International Patent Application No. PCT/EP2019/070713, filed Jul. 31, 2019, entitled "LIQUID-BASED HEAT EXCHANGER," which claims priority to United Kingdom Patent Application No. 1812592.2 filed Aug. 2, 2018 titled "LIQUID-BASED HEAT EXCHANGER," the disclosures of which are hereby incorporated by reference in their entirety.

FIELD

The present application relates to heat exchangers and in particular to a liquid-based heat exchanger which uses the flow of liquid to effect cooling.

BACKGROUND

Electronic components generate heat when performing their electrical service. Some computer components, like CPUs and GPUs can generate a tremendous amount of heat in a relatively small area. If this heat is not extracted effectively, the chips will heat to unsafe temperatures and fail.

Historically, the main coolant used for cooling electronics is air. Due to its poor thermophysical properties, metal finned heat sinks and fans are employed in order to sufficiently cool the chips. However, many of today's components are generating so much heat that air cooling is no longer feasible.

A typical CPU package (100) used in data centre server modules is shown in FIG. 1 and comprises a silicon die (105) which defines a packaging substrate. A chip (110) which comprises the electronic circuitry of the package is in thermal contact with a layer of thermal interface material (TIM1) (115). Above this is an integrated heat spreader (IHS) (112) which serves to thermally dissipate the heat generated by the chip over a larger footprint. A second TIM layer (TIM2) (111) is in thermal contact with the IHS and provides a thermal path to a convective heat sink (120). Traditionally, very aggressive air cooling with an attached metallic finned heat exchanger can provide a maximum cooling effectiveness, heretofore referred to as the effective thermal conductance, of about 1500 W/m$^2$K. This represents an upper limit of air cooling technology as it represents over half of the thermal resistance budget of the integrated package. Thus, the ineffectiveness of air cooling largely defines the maximum thermal power, and thus the computing capacity, of CPUs. It is noted here that the same can be said for GPUs and other high-power electronics, so a CPU is used here as a generic example of high power electronics.

In such a scenario, where a 15 mm×15 mm processor is considered, the chip to air thermal resistance is about 0.8 K/W, as shown in the accompanying graph. For an allowable chip to air temperature difference of 50K, this limits the thermal power to about 60 W. This is referred to as the thermal design power (TDP), which is directly related to the level of computational service provided by the CPU i.e. increasing the computational service of a CPU increases the power.

Thus, there is currently a massive shift to liquid cooling of electronics, which requires that new technologies be developed. This has particular application in the cooling of data centres. Liquid cooling of the CPUs and other components in data centre server modules is a limited yet rapidly growing sector in an already massive market. One aspect that is driving liquid cooling is the escalating power of chips such as CPUs and GPUs. Another hugely growing concern is the energy use of data centres. For example, data centres are utilizing around 8% of the total electricity supplied within and to Ireland and this is predicted to triple over the next 10 years. This is quite unsustainable and crosses economic, environmental, political and societal lines. Incredibly, the use of chilled air for data centre cooling accounts for about 50% of the total electricity consumption.

Liquid coolers, termed waterblocks, have been commercially available for some time now, though the menu of commercial waterblocks has increased significantly in the past 5-10 years. Generally, commercially available waterblocks are bulky, complex to manufacture and assemble, expensive and completely sealed and self-contained units. They are also fairly low performance and require large volume flow of water to perform the required cooling function. This later issue is relevant as the level of flow requirement necessitates commensurately large pumps, or even worse, mains water supply into the server (computer).

For desktop-type computers the large pumps together with the aforementioned bulky form factor of conventional waterblocks are not particularly problematic as there is real estate available. In data centre servers, which are much more compact and crowded, with about 44.85 mm of vertical height, there is simply no space for large pumps and waterblocks. This is a problem, which is limiting uptake of liquid cooling in data centres.

There are many commercially available liquid cooling systems on the market today. These vary with regard to thermal performance and form factor. An example of a known cooling system is described in EP3344025 assigned to EKWB Inc. This system is a complex hybrid slot jet and microchannel waterblock cooler and is an example of how a liquid can be used to efficiently transfer heat away from electronic components such as those arranged on a PCB. However, for server applications, a major constraint is the form factor of 1U server modules, which have a height of less than 44.85 mm. Including the PCB and chip, this leaves only about 30 mm of vertical headroom for the heat exchanger, and this must of course include any fluid connections. This being said, devices like that described in EP3344025 are only used in 2U and larger server modules.

In terms of 1U servers with liquid cooling, ASETEK Inc. is likely the market leader and an example of their technology is described in EP2867743. This system is compact and fits easily within the 1U form factor, that is typical for server racks. Additionally, their cooling system integrates the pump directly into the waterblock overall package. Although the thermal performance is marginal, the form factor and functionality of the integrated pump has proven successful and facilitates other inventive packaging options such as 'internal loop cooling' whereby the air-liquid heat exchanger is also integrated into the 1U server module. Problematically however, a single pump per waterblock represents a single point of failure. In server modules, it is current best practice to incorporate redundancy for key components (UPS, fans etc), which is not the case with the ASETEK system. Thus, this system has successfully penetrated the liquid cooled server market, but suffers from relatively low thermal performance (from a liquid cooling point of view) and real or perceived reliability issues associated with the lack of redundancy of the integrated pump.

Regardless of the water-cooled technology, one thing that is common across all of the devices in commercial circulation is the method by which the effective thermal conductance is enhanced in order to achieve their target effective thermal resistance conductance. Invariably, the effective thermal conductance is increased over that of simple channel or impinging liquid flow by machining small surface features into the metallic (copper) base of the unit. Known units use fins to form microchannels in order to enhance the effective thermal conductance of the overall cooling system. The ASETEK unit simply floods the channels through large inlet and outlet ports, whereas that provided by EKWB Inc forms a central perpendicular slot jet which impinges centrally on the fins and then spreads and flows through the formed microchannels to the periphery, where it exits. The impinging slot jet together with the confined microchannel flow act together and in such a way as to provide very high convective heat transfer coefficients. This is why the EKWB Inc system has such a high effective thermal conductance (low thermal resistance) and in terms of commercial waterblock heat sinks, this hybrid jet impingement-microchannel concept is the key differentiator, which makes it the front runner in terms of performance. However, a top-down fluid delivery system is required by this technology to force the liquid downward and through the slot jet orifice. This means that the fluidic connections must be located at the top, which is not ideal for 1U server modules due the limited height requirement. Furthermore, the EKWB Inc system suffers in that it is formed from multiple parts—the overall structure being stacked and integrated mechanical assemblies, thereby requiring multiple seals.

Another known arrangement is described in US2013/0233523 which operates on exploiting efficiencies that result from turbulent flow motion. Liquid is introduced into the device in a direction parallel to orifices defined in a jet plate. US2006/0250774 again introduces liquid coolant into the device in a direction parallel to the liquid flow through a plurality of jet orifices. The liquid also exits the device in that same parallel direction.

There therefore continues to exist a need for very compact and very high performance liquid-based cooling arrangements which can be effective in lowering the operating temperatures of electronic components.

SUMMARY

In accordance with the present teaching, these and other problems are addressed by a highly integrated and compact hydraulic flow delivery device that provides very high velocity impinging liquid flow onto a target heat transfer surface. In accordance with the present teaching, a device comprises a housing having a fluid inlet and a fluid outlet, the fluid inlet being in fluid communication with a plenum entry chamber, the plenum chamber comprising a jet orifice plate which defines a plurality of jet orifices through which a pressurised liquid can operably exit the plenum entry chamber, contact a thermal surface, and exit the device via the fluid outlet.

In one arrangement the housing defines at least one exit channel, the exit channel being downstream of the jet orifices, then at least one exit channel being configured to deliver fluid exiting the jet orifices to the fluid outlet.

The housing is desirably configured to be top mounted onto an electronic component. Liquid passing through the jet orifices is operably directed downwardly under pressure in a direction towards the electronic component.

The jet orifice plate desirably defines a base of the plenum chamber, the plenum chamber further comprising side walls extending upwardly from the base. In such an arrangement, the exit channel desirably shares the side walls with the plenum chamber, the plenum chamber being provided on a first side of the side walls and the exit channel being provided on a second side of the side walls.

In a first embodiment, the exit channel is wholly defined within the housing, such that the housing comprises a distinct plenum chamber and a distinct exit channel, each being in respective fluid communication with the fluid inlet and the fluid outlet, the plenum chamber being provided on a first side of the jet orifice plate and the exit channel being provided on a second side of the jet orifice plate, the jet orifice plate defining at least a portion of an upper surface of the exit channel, the thermal surface defining at least a portion of a lower surface of the exit channel.

In another embodiment, the device comprises a skirt defining a sealing surface which operably abuts and seals against the electronic component. On sealing against the electronic component, an upper surface of the electronic component defines a lower surface of the exit channel. In one aspect this upper surface of the electronic component is an integrated heat spreader, IHS, layer of the electronic component. In another aspect, this upper surface is a layer of thermal interface material, TIM, that forms a part of the electronic component.

Accordingly, a first embodiment of the application provides a liquid cooled thermal heat sink as detailed in claim 1. Such a device includes a plurality of jet orifices, which provide an exit for pressurised liquid to exit a plenum chamber and impinge on a thermal surface whereby they effect a cooling of the thermal surface, the heated liquid being transferred through an exit channel to dissipate heat away from the thermal surface. Advantageous embodiments are provided in the dependent claims.

BRIEF DESCRIPTION OF THE DRAWINGS

The present application will now be described with reference to the accompanying drawings in which:

FIG. 2 is a plan view from above of a first embodiment of a device in accordance with the present teaching.

FIG. 3 is a plan view from below of the device of FIG. 2 in accordance with the present teaching.

FIG. 4A is a section along the line A-A of the device of FIG. 2.

FIG. 4B is an exploded view of the device of FIG. 2.

FIG. 5B is an exploded view of the device of FIG. 5A.

FIG. 9 is a perspective view from above of the device of FIGS. 5-8.

FIG. 10 is a perspective view from below of the device of FIGS. 5-8.

FIG. 11 is a view along the X plane of the device of FIG. 9.

FIG. 12 is a view along the Y plane of the device of FIG. 9.

FIG. 13 is a view along the Z plane of the device of FIG. 9.

DETAILED DESCRIPTION OF THE DRAWINGS

Figure 1:
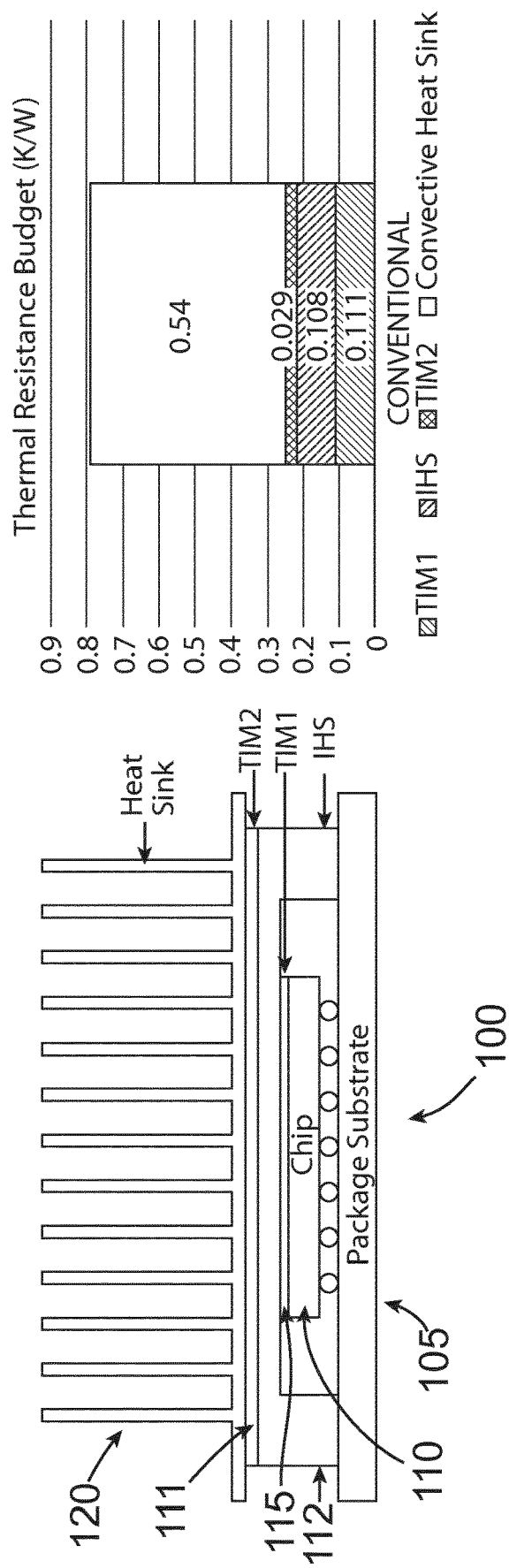
FIG. 1 is an example of a known CPU package and associated air-cooled heat sink fins.
Figure 8:
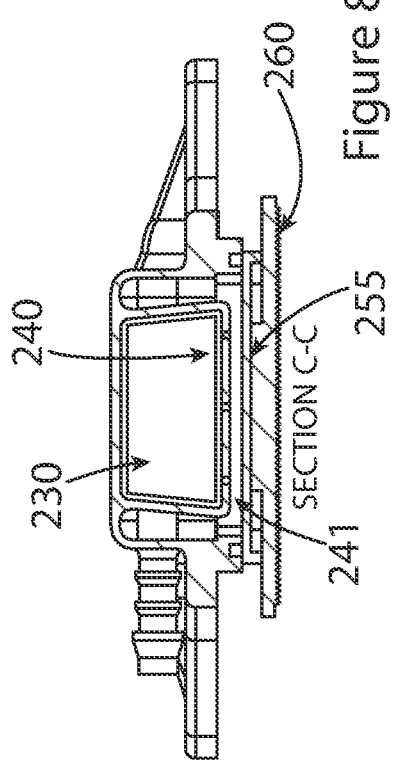
FIG. 8 is a section along the line C-A of the device of FIG. 7
Figure 6:
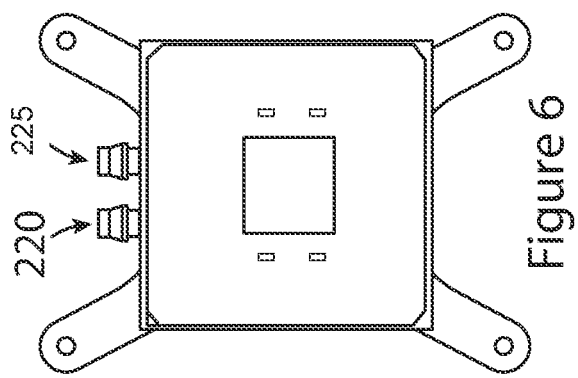
FIG. 6 is a plan view from below of the device of FIG. 5A in accordance with the present teaching.

FIGS. 2 to 4B show an example of a device 200 in accordance with the present teaching. The device comprises a housing 210 having a fluid inlet 220 and a fluid outlet 225. The fluid inlet 220 is in fluid communication with a plenum chamber 230. The plenum chamber is wholly defined within the housing and comprises a jet orifice plate 240 which defines a plurality of jet orifices 241. The jet orifices are distributed across the surface of the jet orifice plate and provide a fluid outlet through which a pressurised liquid can operably exit the plenum chamber. On exiting the jet orifices, the pressurised fluid contacts a thermal surface 250 and operably dissipates heat away from that thermal surface. The device is configured to operably direct that heated fluid away from the thermal surface to exit the device via the fluid outlet 225. The thermal surface is arranged to thermally conduct heat away from an electronic component. The thermal surface may comprise a planar upper surface such that the pressurised fluid contacts that planar surface and dissipates heat away from that surface. In another configuration, the upper surface of the thermal surface is not planar, it comprising one or more raised surfaces or perturbations that operatively increase the area of the contact surface with which the pressurised fluid contacts. These raised surfaces or perturbations may adopt one or more different geometrical forms, such as for example dimples or fins that project upwardly towards the jet orifice plate.

To effectively direct the heated fluid away from the thermal surface, the housing defines at least one exit channel 255, the exit channel being downstream of the jet orifices and being configured to deliver fluid exiting the jet orifices to the fluid outlet.

The housing is desirably configured to be top mounted onto an electronic component 260 such as a CPU or GPU. The housing can be secured relative to the electronic component through a mechanical fixing of arms 265 of the housing relative to the substrate on which the electronic component is located.

By top mounting the housing relative to the electronic component that is to be cooled, liquid passing through the jet orifices is operably directed downwardly under pressure in a direction towards the electronic component.

The jet orifice plate 240 desirably defines a base of the plenum chamber. The plenum chamber further comprises side walls 242 extending upwardly from the base 240. In such an arrangement, the exit channel 255 desirably shares the side walls with the plenum chamber, the plenum chamber being provided on a first side of the side walls and the exit channel being provided on a second side of the side walls.

In a first embodiment such as that shown in FIGS. 2-4/4A, the exit channel is wholly defined within the housing, such that the housing comprises a distinct plenum chamber and a distinct exit channel, each being in respective fluid communication with the fluid inlet and the fluid outlet. In exemplary configurations each of the fluid inlet and fluid outlet are perpendicularly offset from the jet orifices. In certain configurations at least one of the inlet and outlet are perpendicularly offset. Where only one of the inlet and outlet are offset, preferably the inlet is perpendicularly offset.

In this embodiment, the plenum chamber is provided on a first side of the jet orifice plate and the exit channel is provided on a second side of the jet orifice plate, the jet orifice plate defining at least a portion of an upper surface of the exit channel, the thermal surface defining at least a portion of a lower surface of the exit channel. In the example of FIG. 4B, the thermal surface 250 is formed from a thermally conductive material such as copper, which is mechanically fixed to the remaining portions of the housing 200. A flange in this exemplary arrangement, formed by an o-ring 265 is seatable within an o-ring channel 266 formed in the housing and which when the thermal surface 250 is mechanically fixed to the housing 200 forms a fluid tight seal such that water entering the exit channel 255 cannot leak before exiting through the exit port. It will be appreciated that the thermal surface could also be formed as an integral component of the overall housing.

In FIG. 4B, we have labelled the IHS 112 and chip 110 with the same reference numerals as were used for the electronic component of FIG. 1.

It will be appreciated that the dimensions of the plenum chamber 230 are relatively large in size compared with the jet orifice dimensions. Typically, the plenum chamber 230 is about 10 times bigger than the individual ones of the jet orifices, —for example a 0.5 mm jet diameter needs 5 mm high plenum.

Fluid enters the chamber from the fluid inlet and the plenum chamber is large enough to stagnate the flow thus pressurizing the chamber uniformly over the array of jet orifices, which are defined in the jet orifice plate, which is located at the bottom of the chamber, as seen clearly in the exploded view of FIG. 4B. This plenum chamber is operably pressurised and forces the fluid evenly through the individual jet nozzles. The nozzles themselves force the working fluid into a lower confined space defined above between the lower surface of the jet orifice plate and the thermal surface 250. As shown in FIGS. 2-4B, this thermal surface can be mechanically fastened with an appropriate face seal or can be an integral component of the housing—fabricated as a component element of the housing, or as will be discussed below with regard to a second embodiment of the present teaching can be formed by the IHS 112 of the component to be cooled itself.

The present inventors have realised that by providing a plenum chamber which generates a stagnant pressurised flow and then using a plurality of jet orifices 241 to force a pressurised liquid flow onto a thermal surface, that it is possible to reduce the actual flow of liquid into the plenum without compromising the overall heat transfer achieved. Typically, conventional liquid-based cooling devices operate with flow rate in the region of 2 to 10 LPM. In contrast, the use of the multiple jet orifices that are distributed across the surface of the jet orifice plate and thereby direct multiple jets of liquid onto the thermal surface allows the flow rate to be reduced to 0.5 LPM.

In addition, by having the exit channel 255 extend circumferentially about the perimeter of the plenum chamber, the exit channel itself facilitates a fully unconfined fluid exit arrangement by creating a 4-sided plenum-type configuration. This exit plenum skirts the plenum chamber in such a way as to virtually stagnate the flow in this intermediate space. It will be understood that this intermediate space, which is a constituent part of the exit channel 255 forms a second stagnant chamber, the first being the plenum chamber. This second exit stagnation chamber is formed by the skirting configuration of the exit channel about the four sides of the plenum chamber. The provision of this skirt chamber keeps the vertical dimension of the overall device low and this is particularly advantageous with the given constraints for the standard dimensioned 1U server configurations. Secondly, by having the skirt chamber extend circumferentially about the plenum chamber, the liquid that has exited the orifice plate is directed equally about all 4 sides defined by the skirt/exit channel. This reduces cross flow in the horizontal jet orifice plate-surface and increases heat transfer effectiveness. For example, if the skirt chamber was not arranged in the fashion considered optimal by the present inventors, and was arranged to exit the device through a single channel that extended along only one side it would cut performance in half. Furthermore, the provision of the skirt chamber reduces overall pressure drop, the velocities are really low and it allows the exit fluid connection to be on any side of the overall device. The pressurized fluid in this skirt chamber is then released through the fluid outlet 225. A benefit of such an arrangement is that since the impinging jets 241 are ostensibly sandwiched between two plenums, the actual location of the inlet 220 and outlet ports 225 is irrelevant. Any north-south, or north-east type fluidic configuration is possible without compromising performance in any way. This is not the case in conventional known waterblocks where the flow delivery and return is very specific to the functioning of the device.

The end result here is that by integrating an exit channel in a skirt-type wrap-around plenum chamber, the highest thermal and hydraulic performance is facilitated with an extremely compact form factor with a host of fluid connector packaging options. Some key features that this enables are related to packaging fluidic systems in 1U server modules. Not only is the form factor and fluidic connections suitable for this type of package, its low volumetric flow rate requirement facilitates the integration of suitably small circulation pumps into the 1U architecture as well as reducing cost and increasing product manufacturing cycle times. For the latter, the manufacturing cost and fabrication rates are directly related to the build height of the finished product, which here is only about 15 mm, which can be considered quite small.

Figure 5A:
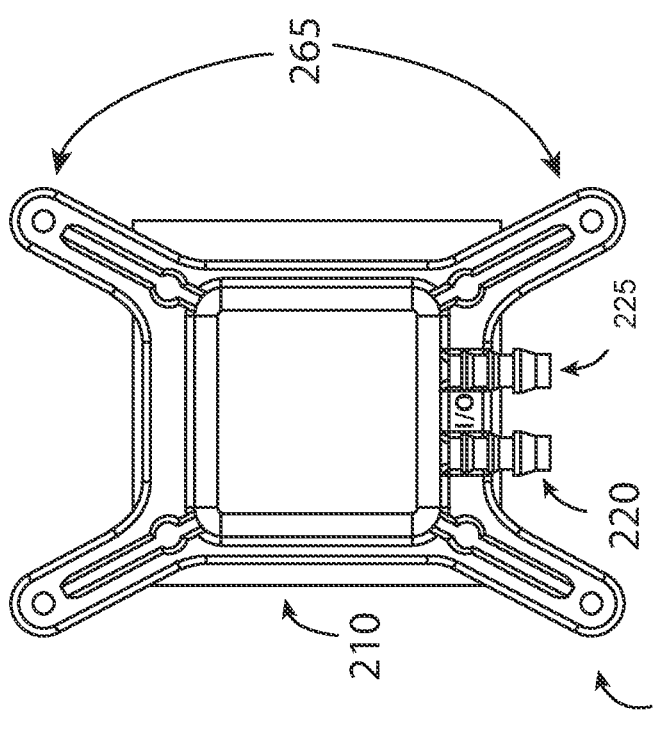
FIG. 5A is a plan view from above of a second embodiment of a device in accordance with the present teaching.
Figure 7:
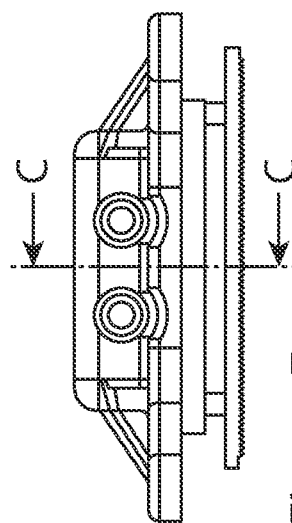
FIG. 7 is a side view of the device of FIG. 5A.

In another embodiment described with reference to FIG. 5-11, where similar components are described with reference to the same numerals, the device comprises a skirt defining a sealing surface which operably abuts and seals against the electronic component. FIG. 5B is an exploded view of the device of FIG. 5A and similar reference numerals are used for similar components to that described with reference to FIG. 4B. On sealing against the electronic component, an upper surface of the electronic component defines a lower surface of the exit channel. In this exemplary aspect this upper surface of the electronic component is an integrated heat spreader (IHS) layer 112 of the electronic component. In another aspect, this upper surface is a layer of thermal interface material (TIM) that forms a part of the electronic component. The use of an o-ring 265 forms a seal between the IHS layer 112 and the remaining portion of the exit channel 255 such that the IHS layer forms the actual thermal surface 250 against which the liquid exiting the jet orifices 241 impinge before that liquid travels through the skirt arrangement of the exit channel 255 to exit through the exit port 225.

The effectiveness of a convective heat transfer device in accordance with the present teaching is related to the product of the convective heat transfer coefficient (h) and the wetted heat transfer surface area (A), such that H=hA (higher is better). Therefore, to increase the conductance, H, the options are to either increase h or A. Conventional waterblock technologies rely on micro or meso scale fins of some sort in order to increase A. This is hugely constraining in terms of cost, performance, functionality and scalability. In accordance with the present teaching the need for machined fins on the base is obviated. To achieve such high performance without requiring surface structures, the present teaching uses small and very high velocity impinging jets. The use of impinging jets offer extremely high convective heat transfer coefficients.

A device in accordance with the present teaching offers significant reduction in flow rate and its importance cannot be overstated since the physical size of the pump is directly related to the volumetric flow rate, not pumping pressure. Conventional waterblocks are designed to work at flow rates between 2-10 LPM, which necessitate unrealistically large pumps, certainly not ones that can be packaged in a 1U server modules before even considering the fact that that server modules require 2 CPUs (therefore 2 pumps) and newer servers incorporate 4 CPUs. The problem escalates significantly considering that server packages are built with redundancy on all crucial components, meaning that for every pump a second one is required. The low flow rate (≤0.5 LPM) that is required for a device in accordance with the present teaching can use a single micropump to serve two units, such that it, along with a redundant pump, are easily packaged in a 1U server module.

It is appreciated that the pressure loss coefficient across a small (<1 mm diameter) nozzle of each jet orifice is high. However, by providing a plurality of jet orifices, each defining an individual nozzle, and arranging the nozzles hydraulically in parallel means that the pressure drop across all of the nozzles is the same as that of one nozzle. Regardless of the high loss coefficient, the pressure drop of a fluidic system increases with the square of the volumetric flow rate. Therefore, although the jets have a high loss coefficient, it can still produce a moderate/equivalent pressure drop due to the low flow rate and the parabolic relationship between pressure drop and flow rate. Furthermore, from an energy use perspective, an equivalent pressure drop at ¼ the flow rate will use ¼ the power. Finally, the plenum-sandwich configuration contains the pressure drop to mainly that associated with the jet orifice plate (and some minor expansion/contraction losses) because the flow stagnates.

In short, a device in accordance with the present teaching takes advantage of the tension between a high loss coefficient and low flow rate in order to maintain a low operational pressure drop, and in this what facilitates the use of low flow rate and compact micropump technology. A liquid cooled thermal heat sink is provided. A plurality of jet orifices provides an exit for pressurised liquid to exit a plenum chamber and impinge on a thermal surface whereby they effect a cooling of the thermal surface, the heated liquid being transferred through an exit channel to dissipate heat away from the thermal surface.

Whilst the present teaching has been exemplified with reference to dissipating heat away from an electronic component, it will be appreciated that any heated surface that requires cooling can benefit from the present teaching. In this way for example, a server module that comprises side walls defining an enclosure volume within the module within which assorted electronic components typically requires cooling. A device such as the present teaching can be provided within the server module enclosure to cool specific ones of the electronic components or could be thermally coupled to the side walls to provide a cooling of the overall module.

The words comprises/comprising when used in this specification are to specify the presence of stated features, integers, steps or components but does not preclude the presence or addition of one or more other features, integers, steps, components or groups thereof.

The invention claimed is:

1. A liquid cooled thermal heat sink device comprising a housing having a fluid inlet and a fluid outlet, the fluid inlet being in fluid communication with a plenum chamber, the plenum chamber comprising a jet orifice plate which defines a plurality of jet orifices through which a pressurised liquid can operably exit the plenum chamber and contact a thermal surface, wherein the jet orifice plate defines a base of the plenum chamber, the plenum chamber further comprising side walls extending upwardly from the base, the device further defining surfaces of an exit channel, wherein the exit channel shares the side walls with the plenum chamber, the plenum chamber being provided on a first side of the side walls and the exit channel being provided on a second side of the side walls such that the exit channel extends circumferentially about a perimeter of the plenum chamber, the exit channel being configured to deliver fluid exiting the jet orifices to the fluid outlet, the fluid inlet being perpendicularly offset from the jet orifices, and wherein the plenum chamber is dimensioned to operably form a pressurized chamber, such that fluid flow entering the chamber is stagnated and then exits the chamber via each of the plurality of jet orifices at a constant flow rate, the flow rate exiting the chamber being greater than the flow rate entering the chamber, and wherein the plenum chamber defines a first stagnant chamber and the exit channel defines a second stagnant chamber.

2. The device of claim 1 wherein all surfaces of the exit channel are defined within the housing.

3. The housing of claim 1 configured to be top mounted onto an electronic component such that liquid passing through the jet orifices is operably directed downwardly under pressure in a direction towards the electronic component.

4. The device of claim 1 wherein the exit channel is wholly defined within the housing, such that the housing comprises a distinct plenum chamber and a distinct exit channel, each being in respective fluid communication with the fluid inlet and the fluid outlet, the plenum chamber being provided on a first side of the jet orifice plate and the exit channel being provided on a second side of the jet orifice plate, the jet orifice plate defining at least a portion of an upper surface of the exit channel, the thermal surface defining at least a portion of a lower surface of the exit channel.

5. The device of claim 1 comprising a skirt defining a sealing surface, which operably abuts, and seals against an electronic component.

6. The device of claim 5 configured such that on sealing against the electronic component, an upper surface of the electronic component defines a lower surface of the exit channel.

7. The device of claim 6 wherein the upper surface of the electronic component is an integrated heat spreader, IHS, layer of the electronic component.

8. The device of claim 6 wherein the upper surface is a layer of thermal interface material, TIM, that forms a part of the electronic component.

9. The device of claim 1 wherein the plenum chamber comprises four side walls, the four side walls also forming side walls of the exit channel.

10. The device of claim 1 wherein operatively liquid exiting the jet orifice plate is directed equally about all sides of the plenum chamber.

11. The device of claim 1 wherein the fluid inlet and fluid outlet are provided in side walls of the housing, each of the fluid inlet and fluid outlet being perpendicularly offset from the jet orifices.

12. The device of claim 1 wherein the thermal surface is thermally coupled to a side wall of a server module enclosure.

13. The device of claim 1 wherein the thermal surface comprises a planar upper surface.

14. A liquid cooled thermal heat sink device comprising a housing having a fluid inlet and a fluid outlet, the fluid inlet being in fluid communication with a plenum chamber, the plenum chamber comprising a jet orifice plate which defines a plurality of jet orifices through which a pressurised liquid can operably exit the plenum chamber and contact a thermal surface, the device further defining surfaces of at least one exit channel, the at least one exit channel sharing surfaces with, and extending circumferentially about, a perimeter of the plenum chamber, wherein the plenum chamber comprises four side walls, the four side walls also forming side walls of the at least one exit channel, the at least one exit channel shares the side walls with the plenum chamber, the plenum chamber being provided on a first side of the side walls and the at least one exit channel being provided on a second side of the side walls such that the at least one exit channel extends circumferentially, about a perimeter of the plenum chamber, the at least one exit channel being configured to deliver fluid exiting the jet orifices to the fluid outlet, the fluid inlet being perpendicularly offset from the jet orifices, wherein the plenum chamber is dimensioned to operably form a pressurised chamber such that fluid flow entering into the chamber is stagnated and then exits the chamber via each of the plurality of jet orifices at a constant flow rate, the flow rate exiting the chamber being greater than the flow rate entering the chamber, wherein the plenum chamber defines a first stagnant chamber and the at least one exit channel defines a second stagnant chamber.

15. The device of claim 14 wherein operatively liquid exiting the jet orifice plate is directed equally about all sides of the plenum chamber.

* * * * *